US010529661B2

(12) United States Patent
Wei (10) Patent No.: US 10,529,661 B2
(45) Date of Patent: Jan. 7, 2020

(54) MULTILAYER INDUCTOR AND THE FABRICATION METHOD THEREOF

(71) Applicant: CYNTEC CO., LTD., Hsinchu (TW)

(72) Inventor: Chih Hung Wei, Hsinchu (TW)

(73) Assignee: CYNTEC CO., LTD, Hsinchu (TW)

( * ) Notice: Subject to any disclaimer, the term of this patent is extended or adjusted under 35 U.S.C. 154(b) by 69 days.

(21) Appl. No.: 15/585,168

(22) Filed: May 3, 2017

(65) Prior Publication Data

US 2017/0323851 A1 Nov. 9, 2017

Related U.S. Application Data

(60) Provisional application No. 62/331,991, filed on May 5, 2016, provisional application No. 62/404,223, filed on Oct. 5, 2016.

(51) Int. Cl.
| | |
|---|---|
| H01L 23/522 | (2006.01) |
| H01F 17/00 | (2006.01) |
| H01F 27/34 | (2006.01) |
| H01L 49/02 | (2006.01) |
| H01L 21/302 | (2006.01) |

(52) U.S. Cl.
CPC ..... *H01L 23/5227* (2013.01); *H01F 17/0013* (2013.01); *H01F 27/34* (2013.01); *H01L 21/302* (2013.01); *H01L 28/10* (2013.01)

(58) Field of Classification Search
CPC ............... H01L 23/5227; H01L 21/302; H01F 17/0013; H01F 27/34
See application file for complete search history.

(56) References Cited

U.S. PATENT DOCUMENTS

| | | | | |
|---|---|---|---|---|
| 2013/0038417 A1* | 2/2013 | Kim | ............ | H01F 17/0013 336/192 |
| 2014/0333407 A1* | 11/2014 | Otsubo | ............ | H01F 17/0013 336/200 |
| 2016/0196913 A1* | 7/2016 | Kim | ............ | H01F 17/0033 336/83 |
| 2017/0256353 A1* | 9/2017 | Park | ............ | C08K 3/28 |

* cited by examiner

*Primary Examiner* — Bilkis Jahan
*Assistant Examiner* — Victor V Barzykin
(74) *Attorney, Agent, or Firm* — Min-Lee Teng; Litron Patent & Trademark Office (57) ABSTRACT

A conductive element made of magnetic layers each being made of a first magnetic material, a trench is formed in each of the magnetic layer with the bottom surface of the trench being located higher than the bottom surface of the magnetic layer, wherein a second material is disposed in the trench and a conductive layer is disposed over the trench for forming the conductive element.

20 Claims, 6 Drawing Sheets

MULTILAYER INDUCTOR AND THE FABRICATION METHOD THEREOF

CROSS-REFERENCES TO RELATED APPLICATIONS

This application claims the benefit of U.S. Provisional Patent Application Nos. 62/331,991 filed on May 5, 2016 and 62/404,223 filed on Oct. 5, 2016, which are hereby incorporated by reference herein and made a part of specification.

BACKGROUND OF THE INVENTION

I. Field of the Invention

The present invention relates to an inductor, and in particularly, to an inductor made by a laminated ceramic process.

II. Description of the Prior Art

In recent years, electronic products such as mobile devices have become thinner and smaller while their functionalities have kept increasing. As such, different voltages need to be generated from a battery of the mobile device so that the different voltages can be applied to different components, such as an LCD screen or wireless module in the mobile device. The multilayer laminated ceramic technology can be used to make a multilayer inductor that can be used in a DC-DC convertor, the design goals including a higher saturation current, a lower direct-current resistance (DCR) and a higher resonant frequency.

Conventional laminated ceramic processes can be divided into wet and dry processes. Taking a multilayer inductor as an example, a spiral coil can be formed by electrically connecting the conductive layers formed on multiple magnetic layers.

Figure 1A:
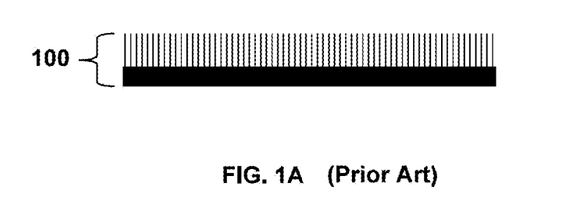
FIG. 1A-1D illustrate a cross-sectional view of a conventional structure of a multilayer inductor.

Please refer to FIG. 1A, which illustrates a cross-sectional view of a conventional structure 100 including a magnetic layer 102 disposed on a PET film 111.

Figure 1B:
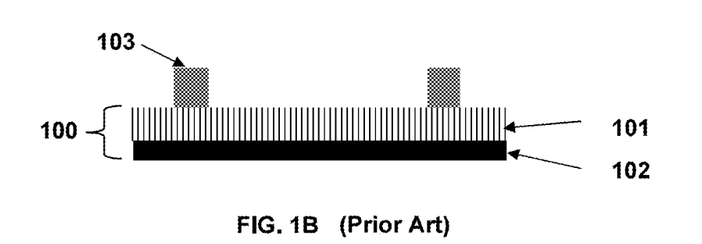

Please refer to FIG. 1B, which illustrates a cross-sectional view of a conventional structure 100, wherein a conductive layer 103 is disposed on the magnetic layer 102.

Figure 1C:
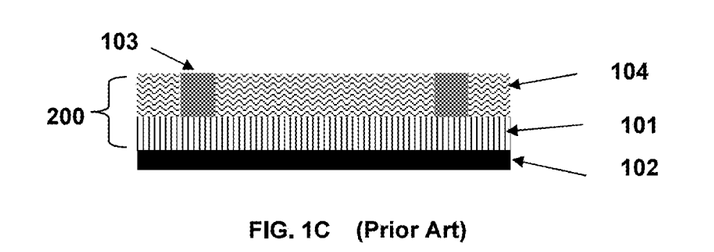

Please refer to FIG. 1C, which illustrates a cross-sectional view of a conventional structure 200, wherein an adhesive layer 104 is disposed on the magnetic layer 102 for encapsulating the conductive patterns of the a conductive layer 103.

Figure 1D:
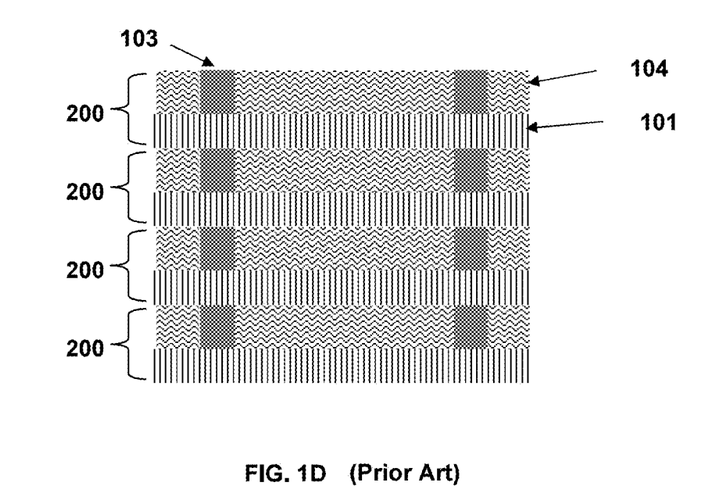

Please refer to FIG. 1D, which illustrates a cross-sectional view of a conventional structure in which a plurality of the structures of FIG. 1C are stacked together.

Figure 2A:
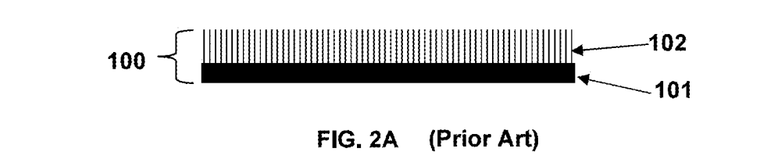
FIG. 2A-2E illustrate a cross-sectional view of another conventional structure of a multilayer inductor.

Please refer to FIG. 2A, which illustrates a cross-sectional view of a conventional structure 100 including a magnetic layer 102 disposed on a PET film 111.

Figure 2B:
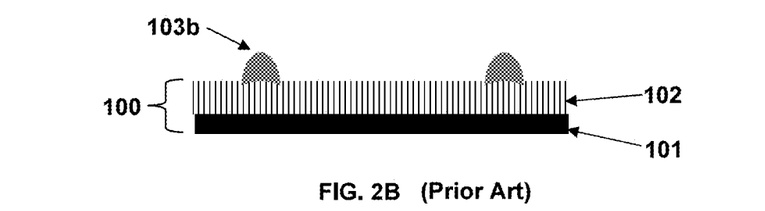

Please refer to FIG. 2B, which illustrates a cross-sectional view of a conventional structure 100, wherein the conductive layer 103b is disposed on the magnetic layer 102.

Figure 2C:
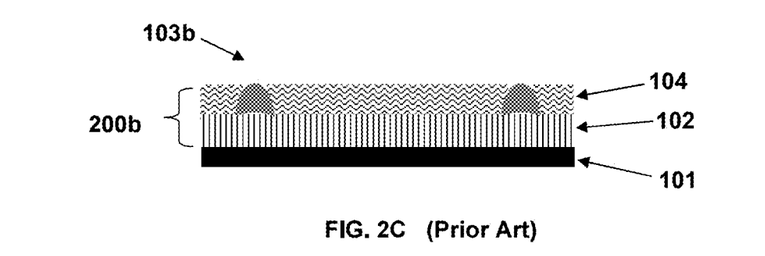

Please refer to FIG. 2C, which illustrates a cross-sectional view of a conventional structure 200b, wherein the adhesive layer 104 is disposed on the magnetic layer 102 for encapsulating the conductive patterns of the a conductive layer 103b.

Figure 2D:
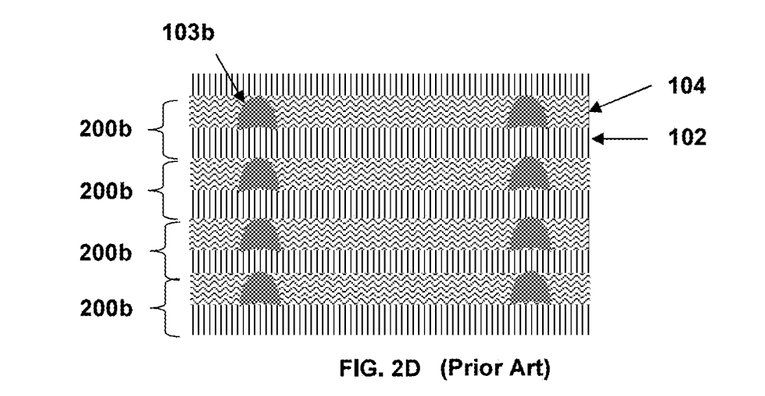

Please refer to FIG. 2D, which illustrates a cross-sectional view of a conventional structure in which a plurality of the structures of FIG. 1C are stacked together.

Figure 2E:
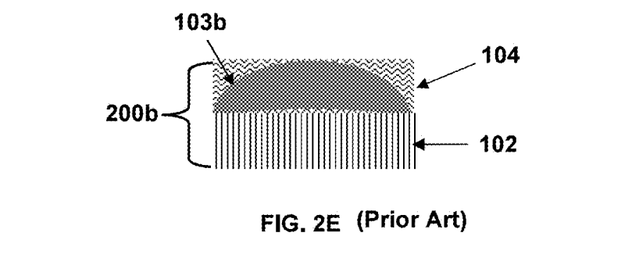

Please refer to FIG. 2E, which illustrates a cross-sectional view of an enlarged portion of the structure 200b, wherein the conductive layer 103b is disposed on the magnetic layer 102, and the adhesive layer 104 is disposed on the magnetic layer 102 for encapsulating the conductive patterns of the conductive layer 103b.

For obtaining a low-direct current resistance (DCR) of the inductor as shown in FIG. 1D, the thickness of each circuit layer needs to be as thick as possible for reducing the direct-current resistance (DCR) of the inductor. However, by doing so, as the number of stacked layers increases, the total thickness difference between the conductive layers and the ceramic layers also increase, hence making it not only difficult to control inductance value but also prone to cause structural deformation of the multilayer inductor.

Accordingly, the present invention proposes a better way to design a multilayer inductor to overcome the above-mentioned problems.

SUMMARY OF THE INVENTION

One objective of the present invention is to provide a multilayer laminated inductor to reduce the overall thickness thereof.

One objective of the present invention is to provide a multilayer laminated inductor with high saturation current and low direct-current resistance (DCR).

One embodiment of the present invention is to provide a multilayer electrical component, wherein the multilayer electrical component comprises: a plurality of magnetic layers stacked over one another, wherein each magnetic layer is made of a first magnetic material, and wherein for each magnetic layer, a trench is formed in the magnetic layer, the bottom surface of the trench being located higher than the bottom surface of the magnetic layer; a second material that is different from the first material is disposed in the trench in the magnetic layer; and a conductive layer comprising at least one conductive pattern, wherein at least one portion of the at least one conductive pattern is disposed on the second material, for forming a conductive element of the electrical component.

One embodiment of the present invention is to provide a multilayer inductor is disclosed, wherein the multilayer inductor comprises: a plurality of magnetic layers stacked over one another, wherein each magnetic layer is made of a first magnetic material, and wherein for each magnetic layer, a trench is formed in the magnetic layer, the bottom surface of the trench being located higher than the bottom surface of the magnetic layer; a second material is disposed in the trench in the magnetic layer; and a conductive layer is disposed on the second material, wherein the second material is different from and has a lower permeability than the first magnetic material, wherein the conductive layers are electrically connected to form a coil.

In one embodiment, the second material is made of dielectric material with a lower dielectric coefficient than the first material.

In one embodiment, the second material is made of dielectric material that has a dielectric coefficient in the range of 4 to 8.

In one embodiment, the second material is made of conductive and adhesive material.

In one embodiment, the conductive layer is made of conductive and adhesive material.

In one embodiment, the conductive layer is made of the second material, wherein the conductive layer extends into the trench.

In one embodiment, each conductive layer is made of the second material, wherein the conductive layer extends into the trench, and wherein two adjacent magnetic layers made of the first material are in contact with each other through a pressing process.

In one embodiment, the second material is made of dielectric material, and the interface 361 between the first magnetic material and the dielectric material is reacted to form a shielding layer for blocking magnetic flux generated by the current loop of the coil so as to increase the saturation current of the inductor and to obtain a higher resonant frequency of the inductor.

In one embodiment, the first magnetic material is made by mixing ferrite powder and organic carrier.

In one embodiment, the first magnetic material is made by mixing metal alloy powder and organic carrier.

In one embodiment, the second material is made of glass rubber.

In one embodiment, the conductive layer is made of conductive and adhesive material, wherein the conductive and adhesive material comprises copper or silver.

In one embodiment, the conductive layer on each magnetic layer comprises a spiral coil pattern disposed on a corresponding dielectric layer, wherein the width of the spiral coil on each magnetic layer is greater than the width of the trench.

In one embodiment, the conductive layer on each magnetic layer comprises a spiral coil pattern disposed on a corresponding dielectric layer, wherein the width of the spiral coil on each magnetic layer is equal to the width of the trench In one embodiment, the second material is made of dielectric material, wherein a third material comprising magnetic and adhesive material is filled into the non-patterned area of each conductive layer.

In one embodiment, the plurality of magnetic layers are stacked over one another through a dry laminated ceramic process.

In one embodiment, the plurality of magnetic layers are stacked over one another through a wet laminated ceramic process.

One embodiment of the present invention is to provide a multilayer inductor, wherein the multilayer inductor comprises: a plurality of magnetic layers stacked over one another, wherein each magnetic layer is made of a first magnetic material, and wherein for each magnetic layer, a trench is formed in the magnetic layer, the bottom surface of the trench being located higher than the bottom surface of the magnetic layer; a dielectric material is disposed in the trench in the magnetic layer; and a conductive layer is disposed on the dielectric material, wherein the dielectric material is different from and has a lower permeability than the first magnetic material, wherein the conductive layers are electrically connected to form a coil.

One embodiment of the present invention is to provide a multilayer inductor, wherein the multilayer inductor comprises: a plurality of magnetic layers stacked over one another, wherein each magnetic layer is made of a first magnetic material, and wherein for each magnetic layer, a trench is formed in the magnetic layer, the bottom surface of the trench being located higher than the bottom surface of the magnetic layer, wherein a conductive layer is disposed on the magnetic layer and extends into the trench, wherein the conductive layers are electrically connected to form a coil.

One embodiment of the present invention is to provide a method to form an inductive component, the method comprising: forming a plurality of magnetic layers separately, wherein for each magnetic layer, a trench is formed on the top surface of the magnetic layer, the bottom surface of the trench being located higher than the bottom surface of the magnetic layer, wherein a dielectric layer is disposed in the magnetic layer, wherein a conductive layer is disposed on the dielectric layer; and stacking the plurality of magnetic layers together, wherein the conductive layers are electrically connected to form a coil.

One embodiment of the present invention is to provide a method to form an inductor, comprising: forming a first trench on the top surface of a first magnetic layer, the bottom surface of the first trench being located higher than the bottom surface of the first magnetic layer; forming a first dielectric layer in the first trench on the first magnetic layer; forming a first conductive layer on the first dielectric layer; forming a second magnetic layer over the first magnetic layer; forming a second trench on the top surface of the second magnetic layer, the bottom surface of the second trench being located higher than the bottom surface of the second magnetic layer; forming a second dielectric layer in the second trench on the second magnetic layer; forming a second conductive layer on the second dielectric layer; and electrically connecting the conductive layers to form a coil.

The detailed technology and above preferred embodiments implemented for the present invention are described in the following paragraphs accompanying the appended drawings for people skilled in the art to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

The following embodiments disclose a multilayer inductor, wherein the multilayer layer inductor comprises: a plurality of magnetic layers stacked over one another, wherein each magnetic layer is made of a first magnetic material, and wherein for each magnetic layer, a trench is formed in the magnetic layer, the bottom surface of the trench being located higher than the bottom surface of the magnetic layer; a second material is disposed in the trench in the magnetic layer; and a conductive layer is disposed on the second material, wherein the second material is different from and has a lower permeability than the first magnetic material, wherein the conductive layers are electrically connected to form a coil.

In one embodiment, the second material is made of dielectric material with a low dielectric coefficient, wherein the interface 361 between the first magnetic material and the dielectric material is reacted to form a shielding layer for blocking magnetic flux generated by the current loop of the coil so as to increase the saturation current of the inductor and to obtain a higher resonant frequency of the inductor.

First Embodiment

This embodiment discloses a way to make a multilayer inductor with a low direct-current resistance (DCR) and a high saturation current based on a dry or wet laminated ceramic process.

Figure 3A:
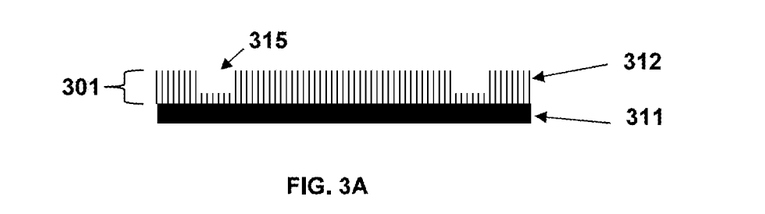
FIG. 3A-3E illustrate a cross-sectional view of a multilayer inductor structure according to an embodiment of the present invention.

Please refer to FIG. 3A, which illustrates a cross-sectional view of a structure 301 including a magnetic layer 312 disposed on a carrier 311, wherein the magnetic layer 312 can be made of ferrite powder and organic material or the first magnetic material can be made of metal alloy powder and organic carrier, but not limited thereto; the carrier 311 can be made of PET or mylar, but not limited thereto. In one embodiment, the magnetic layer 312 is made of a magnetic material comprising magnetic powder such as iron or iron group oxide, which can further include NiCuZn, NiZn or MnZn, but not limited thereto, wherein the permeability of the magnetic powder is in the range of 150-600. In one embodiment, the magnetic layer 312 is made of a magnetic material comprising metal alloy powder, such as FeCrSi or FeAlSi, but not limited thereto, wherein the permeability of the magnetic powder is in the range of 30-50. In one embodiment, the magnetic layer 312 is made of a magnetic material comprising magnetic powder such as Cu—Zn—Fe oxide, but not limited thereto, wherein the permeability of the magnetic powder is in the range of 3-20.

Figure 3B:
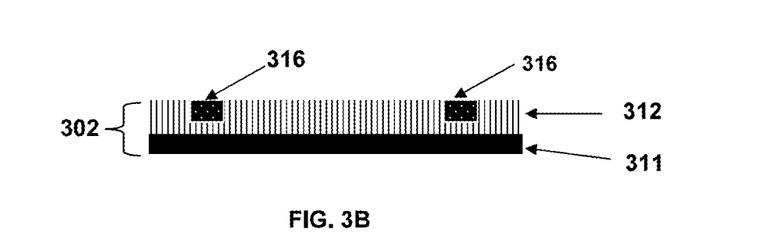

Please refer to FIG. 3B, which illustrates a cross-sectional view of a structure 302 including the magnetic layer 312 disposed on the carrier 311, wherein a trench 315 is formed in the magnetic layer 312. In one embodiment, the trench 315 can be in a spiral shape for forming a coil pattern thereon. Please note that the trench 315 does not penetrate the whole magnetic layer. That is, the bottom surface of the trench 315 is located higher than the bottom surface of the magnetic layer. The trench 315 can be created by physical or chemical etching, such as blade cutting, drilling, hot-melt laser, UV laser, etc., but not limited thereto. In one embodiment, the depth of the trench is equal to or greater than half of the thickness of the magnetic layer.

In one embodiment, the depth of the trench is equal to or greater than ⅔ of the thickness of the magnetic layer. In one embodiment, the depth of the trench is equal to or greater than ¾ of the thickness of the magnetic layer.

Figure 3C:
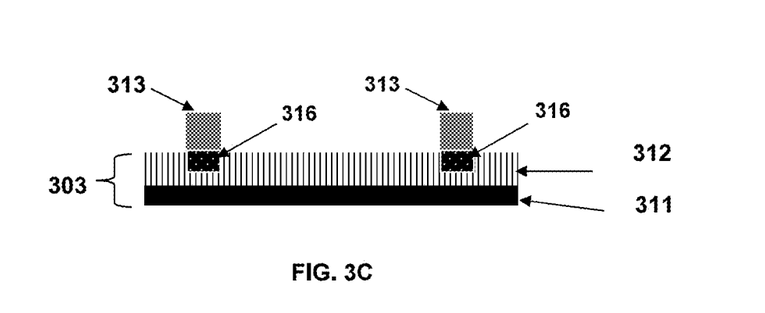

Please refer to FIG. 3C, which illustrates a cross-sectional view of a structure 303 including the magnetic layer 312 disposed on the carrier 311, wherein the trench 315 is formed in the magnetic layer, a dielectric material 316 is disposed in the trench 315. In one embodiment, the dielectric material 316 is disposed in the trench 315 by screen printing. In one embodiment, the dielectric material 316 has a lower dielectric coefficient and lower permeability than the material that forms the magnetic layer 312. In one embodiment, the dielectric material 316 is a glass rubber with low dielectric coefficient and low permeability.

In one embodiment, the dielectric material 316 has a dielectric coefficient in the range of 4 to 8. In one embodiment, the dielectric material 316 has a dielectric coefficient in the range of 5 to 7. In one embodiment, the dielectric material 316 has a dielectric coefficient 6 to 7. In one embodiment, the conductive layer 313 can have a width that is larger or equal to the width of the dielectric material 316 disposed in the trench 315.

Figure 3D:
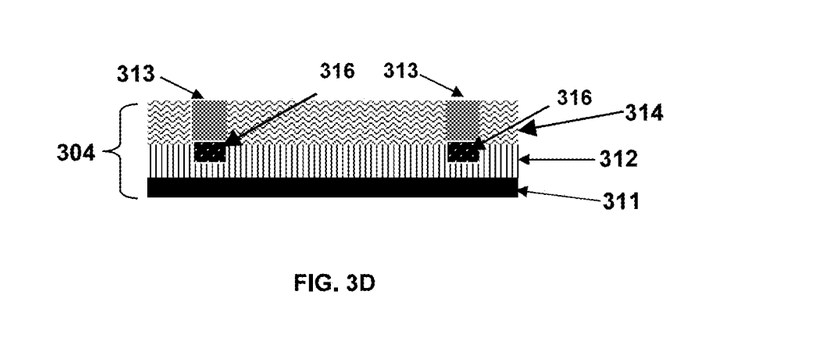

Please refer to FIG. 3D, which illustrates a cross-sectional view of a structure 304 including the magnetic layer 312 disposed on the carrier 311, wherein the trench 315 is formed in the magnetic layer, a dielectric material 316 is disposed in the trench 315, a conductive layer 313 is disposed on the dielectric material 316, wherein the dielectric material 316 is different from and has a lower permeability than the magnetic material that makes the magnetic layer 312, the conductive layer 313 on the dielectric material 316 disposed in the trench 315 of the magnetic layer, wherein a material 314 is filled into the non-patterned area of each conductive layer for encapsulating the conductive patterns of the conductive layer 313. In one embodiment, the material 314 can be a magnetic and adhesive material, which has a lower dielectric coefficient and a lower permeability than the material that forms the magnetic layer 312, wherein the magnetic material can be Cu—Zn—Fe oxide, Al2O3 doped with Si or B, or MgO; or the material 314 can be a glass ceramic mixed with adhesive material, wherein the glass ceramic has a lower dielectric coefficient and a lower permeability than the material that forms the magnetic layer 312. The present embodiment is not limited to the above materials.

Figure 3E:
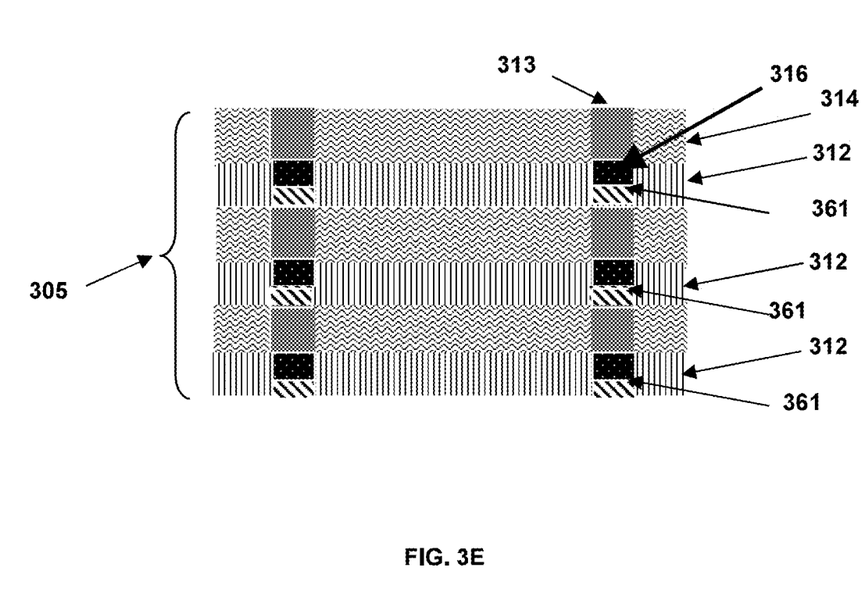

Please refer to FIG. 3E, which illustrates a cross-sectional view of a structure 305 that shows a plurality of structures 304 of FIG. 3D stacked over one another. In one embodiment, the conductive layer 313 disposed on the plurality of the magnetic layers 312 are electrically connected to form a conductive element such as a coil.

The above description is carried out before the multilayer inductor is sintered, wherein each magnetic layer can be also called a magnetic green sheet. When the multilayer inductor is under a sintering process, the sintering process can be carried out in an air or in a nitrogen/hydrogen atmosphere. The sintering process includes a step to remove the organic binder in the magnetic green sheets, by which the densification of the magnetic green sheets can be achieved. During the sintering process, the materials at the interface between the magnetic material of the magnetic layer and the dielectric material disposed in the trench are reacted to form a shielding layer for blocking magnetic flux generated by the current loop of the coil so as to increase the saturation current of the inductor and to obtain a higher resonant frequency of the inductor. Please note that, even after sintering, the magnetic layers can be defined along with the trenches and the conductive layers because each conductive layer has a corresponding magnetic layer, wherein the conductive layer is disposed on a trench that is created in the corresponding magnetic layer, and the trench is either filled with a dielectric or conductive material.

In one embodiment, the second material is made of conductive and adhesive material wherein the conductive and adhesive material in the trench forms a shielding layer for blocking magnetic flux generated by the current loop of the coil so as to increase the saturation current of the inductor and to obtain a higher resonant frequency of the inductor. In addition, by disposing the conductive and adhesive material in the trench can reduce the thickness and direct-current resistance (DCR) of the multilayer inductor.

The self-resonant frequency (SRF) of the multilayer inductor can be expressed by the following formula:

$$SRF = \frac{1}{2*\pi*\sqrt{L*C}}$$

The parasitic capacitance between two adjacent conductive layer of the multilayer inductor can be expressed by the following formula:

$$C = \frac{\varepsilon * S}{d}$$

This embodiment of the present invention can reduce the parasitic capacitance between two adjacent conductive layers of the multilayer inductor because the dielectric material disposed in the trench has a lower dielectric coefficient than the material that forms the magnetic layer 312, thereby increasing the self-resonant frequency (SRF) of the multilayer inductor according to the above formula of SRF.

Second Embodiment

This embodiment disclose a way to make a multilayer inductor with a low direct-current resistance (DCR) and a high saturation current based on a dry laminated ceramic process.

Figure 4A:
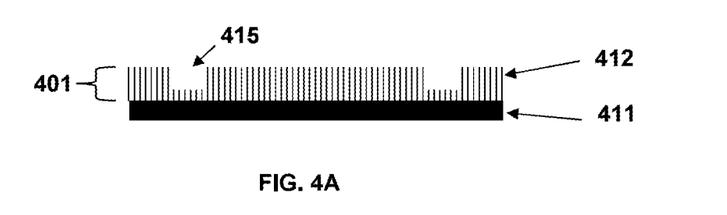
FIG. 4A-4E illustrate a cross-sectional view of another multilayer inductor structure according to an embodiment of the present invention.

Please refer to FIG. 4A, which illustrates a cross-sectional view of a structure 401 including a magnetic layer 412 disposed on a carrier 411, wherein the magnetic layer 412 can be made of ferrite powder and organic material or the first magnetic material can be made of metal alloy powder and organic carrier, but not limited thereto; the carrier 411 can be made of polyethylene terephthalate (PET) with adhesive material or mylar, but not limited thereto. In one embodiment, the magnetic layer 312 is made of a magnetic material comprising magnetic powder, such as iron or iron group oxide, which can further include NiCuZn, NiZn or MnZn, but not limited thereto, wherein the permeability of the magnetic powder in the range of 150~600. In one embodiment, the magnetic layer 312 is made of a magnetic material comprising metal alloy powder, such as FeCrSi or FeAlSi, but not limited thereto, wherein the permeability of the magnetic powder is in the range of 30-50. In one embodiment, the magnetic layer 312 is made of a magnetic material comprising magnetic powder, such as Cu—Zn—Fe oxide, but not limited thereto, wherein the permeability of the magnetic powder is in the range of 3-20.

Figure 4B:
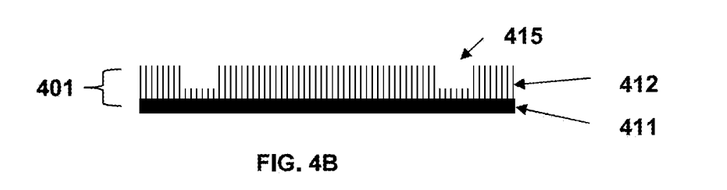

Please refer to FIG. 4B, which illustrates a cross-sectional view of a structure 402 including the magnetic layer 412 disposed on the carrier 411, wherein a trench 415 is formed in the magnetic layer 412. In one embodiment, the trench 415 can be in a spiral shape for forming a coil pattern thereon. Please note that the trench 415 does not penetrate the whole magnetic layer, that is, the bottom surface of the trench 415 is located higher than the bottom surface of the magnetic layer. In one embodiment, the depth of the trench is equal to or greater than half of the thickness of the magnetic layer. In one embodiment, the depth of the trench is equal to or greater than ⅔ of the thickness of the magnetic layer. In one embodiment, the depth of the trench is equal to or greater than ¾ of the thickness of the magnetic layer.

Figure 4C:
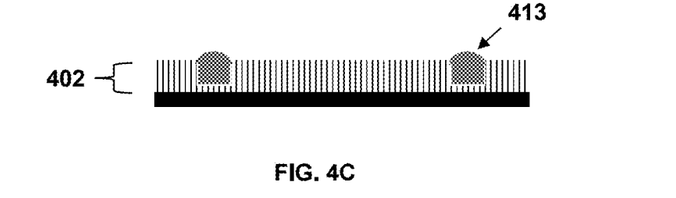

Please refer to FIG. 4C, which illustrates a cross-sectional view of a structure 402 including the magnetic layer 412 disposed on the carrier 411, wherein the trench 415 is formed in the magnetic layer, wherein a conductive and adhesive material 413 is disposed in the trench 415. In one embodiment, the conductive and adhesive material 413 is disposed in the trench 415 by screen printing. In one embodiment, the conductive and adhesive material 413 is a magnetic rubber with low dielectric coefficient and low permeability. In one embodiment, the conductive and adhesive material 413 is a glass rubber with low dielectric coefficient and low permeability.

Figure 4D:
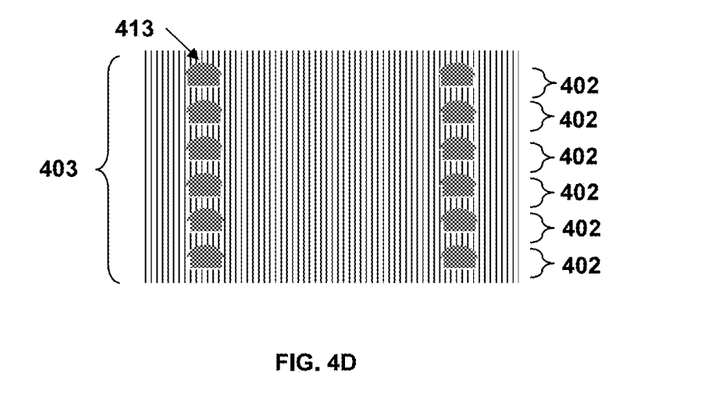

Please refer to FIG. 4D, which illustrates a cross-sectional view of a structure 404 that shows a plurality of stacked structures 403 of FIG. 4C. In one embodiment, the conductive and adhesive material 413 disposed in the trench 415 of the magnetic layer are electrically connected to form a conductive element such as a coil. In one embodiment, the conductive and adhesive material 413 can have a width that is larger or equal to the width of the trench 415.

Figure 4E:
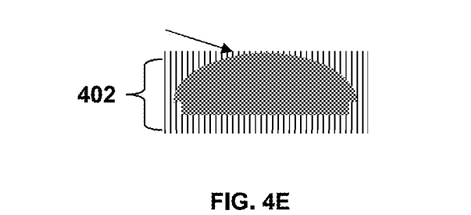

Please refer to FIG. 4E, which illustrates a cross-sectional view of a structure 405 that shows the conductive and adhesive material 413 disposed in the trench 415 of the magnetic layer is in contact with the upper magnetic layer after all of the magnetic layers are stacked together via a pressing process. That is, the conductive and adhesive material 413 forms a conductive layer on the magnetic layer and extends into the trench, wherein the conductive and adhesive material 413 on the magnetic layer is entirely enclosed by the first magnetic material that forms the plurality of magnetic layers. By doing so, there is no need to have such an adhesive layer 104 for encapsulating the conductive patterns on the conductive layer 103b as shown in FIG. 2E. In addition, since the conductive layer extends into the trench, the multilayer inductor can be made thinner while still maintaining the thickness of the conductive pattern or the coil of the multilayer inductor.

Figure 5A:
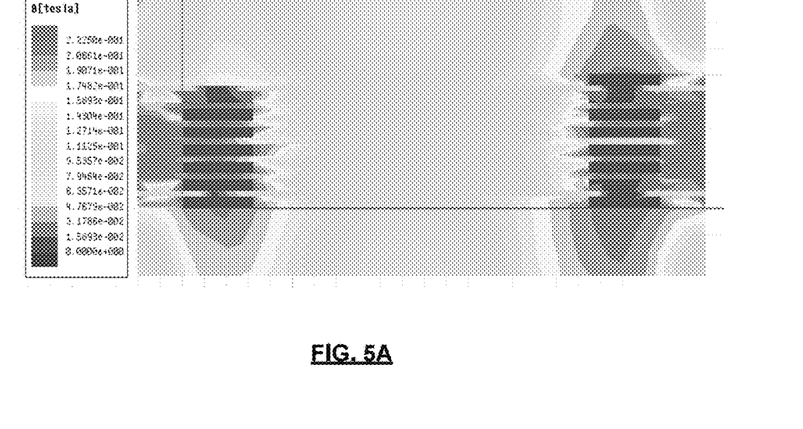
FIG. 5A illustrates the diagram showing the flux distribution of a conventional multilayer inductor.
Figure 5B:
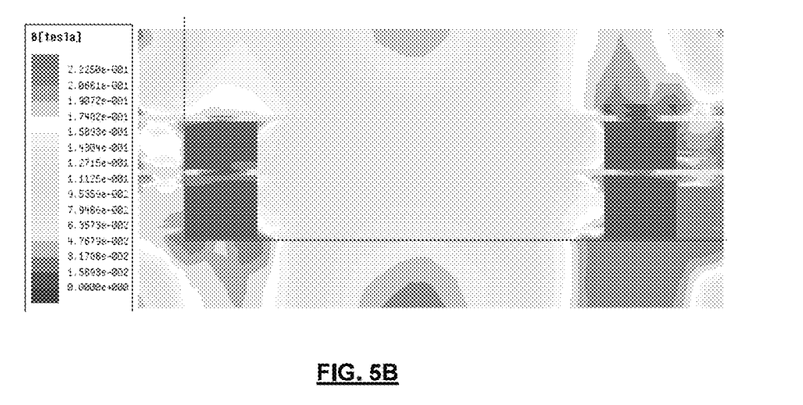
FIG. 5B illustrates the diagram showing the flux distribution of a multilayer inductor according to an embodiment of the present invention.

FIG. 5A illustrates a test result of magnetic flux distribution of a conventional multilayer inductor. FIG. 5B illustrates a test result of magnetic flux distribution of a multilayer inductor according to one embodiment of the present invention. The magnetic flux distribution of the conventional multilayer inductor as shown in FIG. 5A is easily saturated compared with the magnetic flux distribution of the multilayer inductor according to one embodiment of the present invention as shown in FIG. 5B, because, in the multilayer inductor according to one embodiment of the present invention, either dielectric material or conductive material disposed can be disposed in the trench of each magnetic layer, thereby forming a shielding layer for blocking magnetic flux generated by the current loop of the coil, so as to increase the saturation current of the multilayer inductor.

Figure 6:
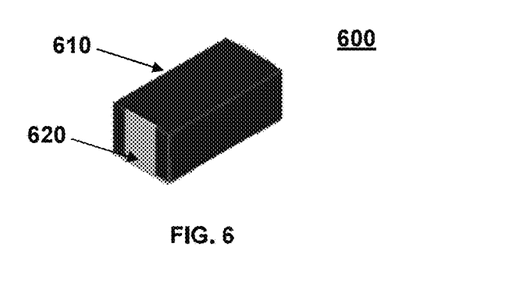
FIG. 6 illustrates an outlook of a multilayer inductor according to an embodiment of the present invention.

FIG. 6 illustrates an outlook of a multilayer inductor 600 according to an embodiment of the present invention, wherein the multilayer inductor 610 is encapsulated in a molding body 610, wherein an electrode 620 is used for connecting with an external circuit.

In summary, by creating a trench on each magnetic layer, the present invention can reduce the overall thickness of the multilayer inductor. In addition, the dielectric material or the conductive and adhesive material disposed in the trench of each magnetic layer can form a shielding layer for blocking magnetic flux generated by the current loop of the coil, so as to increase the saturation current of the multilayer inductor as well as to obtain a higher resonant frequency of the inductor. In addition, by disposing the conductive and adhesive material in the trench of each magnetic layer, one can reduce the overall thickness as well as the direct-current resistance (DCR) of the multilayer inductor. Please note that the present invention can be applied to an inductor as well as other electrical components.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A multilayer electrical component, comprising:
a plurality of magnetic layers vertically stacked over one another, wherein each magnetic layer is made of a first magnetic material and has a corresponding first top surface and a corresponding first bottom surface, and wherein for each magnetic layer having a thickness from the corresponding first top surface to the corresponding first bottom surface, a trench is formed in the magnetic layer, wherein the trench has a first vertical sidewall, a second vertical sidewall opposite to the first vertical sidewall and a second bottom surface connecting the first vertical sidewall and the second vertical sidewall, the second bottom surface of the trench being located higher than the corresponding first bottom surface of the magnetic layer, wherein the second bottom surface of the trench has a flat surface and a height of the first vertical sidewall from the corresponding first top surface of the magnetic layer to the second bottom surface of the trench is equal to or greater than one half of the thickness of the magnetic layer, wherein a second material that is different from and has a lower permeability than the first magnetic material is disposed in the trench of the magnetic layer, wherein a corresponding conductive pattern is disposed on the second material for forming a conductive element.

2. The electrical component as claimed in claim 1, wherein a width of the corresponding conductive pattern is greater than the width of the trench from the first vertical sidewall to the second vertical sidewall.

3. The electrical component as claimed in claim 2, wherein the trench has a spiral shape.

4. The electrical component as claimed in claim 1, wherein the second material is made of a dielectric material.

5. The electrical component as claimed in claim 1, wherein the second material is made of a conductive material.

6. The electrical component as claimed in claim 1, wherein the second material is a conductive material, wherein the conductive material forms the corresponding conductive pattern on the magnetic layer and extends into the trench.

7. The electrical component as claimed in claim 1, wherein the second material is a conductive material, wherein the conductive material forms the corresponding conductive pattern on the magnetic layer and extends into the trench, wherein the corresponding conductive pattern is entirely enclosed by the first magnetic material that forms the plurality of magnetic layers.

8. The electrical component as claimed in claim 1, wherein the first magnetic material comprises magnetic powder comprising iron powder, wherein the permeability of the magnetic powder is in the range of 150~600.

9. The electrical component as claimed in claim 1, wherein the first magnetic material comprises magnetic powder, wherein the permeability of the magnetic powder is in the range of 3-20.

10. The electrical component as claimed in claim 1, wherein the first magnetic material comprises metal-alloy powder, wherein the permeability of the magnetic powder is in the range of 20-50.

11. The electrical component as claimed in claim 1, wherein the second material is made of glass with adhesive material.

12. The electrical component as claimed in claim 4, wherein the conductive element comprises a spiral coil pattern, wherein the maximum width of the spiral coil pattern is greater than the width of the trench.

13. The electrical component as claimed in claim 5, wherein the conductive element comprises a spiral coil pattern, wherein the maximum width of the spiral coil pattern is greater than the width of the trench.

14. The electrical component as claimed in claim 1, wherein the plurality of magnetic layers are vertically stacked over one another through a dry laminated ceramic process.

15. The electrical component as claimed in claim 1, wherein the plurality of magnetic layers are vertically stacked over one another through a wet laminated ceramic process.

16. An inductor, comprising:
a plurality of magnetic layers vertically stacked over one another, wherein each magnetic layer is made of a first magnetic material and has a corresponding first top surface and a corresponding first bottom surface, and wherein for each magnetic layer having a thickness from the corresponding first top surface to the corresponding first bottom surface, a trench is formed in the magnetic layer, wherein the trench has a first vertical sidewall, a second vertical sidewall opposite to the first vertical sidewall and a second bottom surface connecting the first vertical sidewall and the second vertical sidewall, the second bottom surface of the trench being located higher than the corresponding first bottom surface of the magnetic layer, wherein the second bottom surface of the trench has a flat surface and a height of the first vertical sidewall from the corresponding first top surface of the magnetic layer to the second bottom surface of the trench is equal to or greater than one half of the thickness of the magnetic layer, wherein a second material that is different from and has a lower permeability than the first magnetic material is disposed in the trench of the magnetic layer, wherein a corresponding conductive pattern is disposed on the second material for forming a coil.

17. The inductor as claimed in claim 16, wherein the second material is made of a dielectric material.

18. The inductor as claimed in claim 16, wherein the second material is made of a conductive material.

19. The inductor as claimed in claim 16, wherein the second material is a conductive material, wherein the conductive material forms the corresponding conductive pattern on the magnetic layer and extends into the trench, wherein the corresponding conductive pattern is entirely enclosed by the first magnetic material that forms the plurality of magnetic layers.

20. The inductor as claimed in claim 16, wherein a width of the corresponding conductive pattern is greater than the width of the trench from the first vertical sidewall to the second vertical sidewall.

\* \* \* \* \*